United States Patent
Chen et al.

(10) Patent No.: US 12,490,377 B2
(45) Date of Patent: Dec. 2, 2025

(54) COMPOSITE FILMS FOR MOBILE ELECTRONIC DEVICE COMPONENTS

(71) Applicants: SYENSQO SPECIALTY POLYMERS USA, LLC, Alpharetta, GA (US); Cytec Industries Inc., Princeton, NJ (US)

(72) Inventors: Nan Chen, Cumming, GA (US); Lewis Karl Williams, Cumming, GA (US); Val Glade Gunther, South Jordan, UT (US); Marco Apostolo, Senago (IT); Devang Khariwala, Alpharetta, GA (US)

(73) Assignees: Syensqo Specialty Polymers USA, LLC, Alpharetta, GA (US); Cytec Industries Inc., Princeton, NJ (US)

( * ) Notice: Subject to any disclaimer, the term of this patent is extended or adjusted under 35 U.S.C. 154(b) by 0 days.

(21) Appl. No.: 18/681,799

(22) PCT Filed: Aug. 5, 2022

(86) PCT No.: PCT/EP2022/072061
§ 371 (c)(1),
(2) Date: Feb. 6, 2024

(87) PCT Pub. No.: WO2023/012328
PCT Pub. Date: Feb. 9, 2023

(65) Prior Publication Data
US 2024/0373551 A1    Nov. 7, 2024

Related U.S. Application Data

(60) Provisional application No. 63/230,303, filed on Aug. 6, 2021.

(51) Int. Cl.
| | |
|---|---|
| *G02F 1/1333* | (2006.01) |
| *C09K 19/38* | (2006.01) |
| *C09K 19/52* | (2006.01) |
| *H05K 1/03* | (2006.01) |

(52) U.S. Cl.
CPC ....... *H05K 1/0366* (2013.01); *C09K 19/3809* (2013.01); *C09K 19/3814* (2013.01); *C09K 19/52* (2013.01); *H05K 1/0373* (2013.01); *H05K 1/038* (2013.01); *C09K 2019/521* (2013.01); *C09K 2219/03* (2013.01); *C09K 2323/06* (2020.08); *H05K 2201/0141* (2013.01); *H05K 2201/0145* (2013.01)

(58) Field of Classification Search
CPC ................ C09K 19/38; C09K 19/3809; C09K 19/3814; C09K 19/52; C09K 2019/521; G02F 1/1333
See application file for complete search history.

(56) References Cited

U.S. PATENT DOCUMENTS

| | | | |
|---|---|---|---|
| 7,063,892 B2 | 6/2006 | Okamoto et al. | |
| 7,678,721 B2 | 3/2010 | Boessneck et al. | |
| 8,696,932 B2 * | 4/2014 | Uchida | ............. C09K 19/3809 |
| | | | 252/299.01 |
| 8,741,790 B2 | 6/2014 | Tippett et al. | |
| 2003/0005493 P1 | 1/2003 | Twomey et al. | |
| 2012/0135218 A1 | 5/2012 | Shim et al. | |
| 2021/0071082 A1 | 3/2021 | Hara et al. | |
| 2024/0373551 A1* | 11/2024 | Chen | ...................... H05K 1/038 |

FOREIGN PATENT DOCUMENTS

| | | | | |
|---|---|---|---|---|
| CN | 107447363 | * | 12/2017 | ............. D04H 1/10 |
| CN | 117500867 | * | 2/2024 | ............. C08J 5/04 |
| JP | 2006278647 A | | 10/2006 | |
| WO | 1994026802 A1 | | 11/1994 | |
| WO | WO-2022263572 A1 | * | 12/2022 | ......... C09K 19/3809 |

OTHER PUBLICATIONS

"Standard Test Method for Plastics: Dynamic Mechanical Properties: In Torsion;" ASTM International; D5279; 2008; pp. 1-4 (5 pages).

* cited by examiner

*Primary Examiner* — Geraldina Visconti
(74) *Attorney, Agent, or Firm* — Osha Bergman Watanabe & Burton LLP

(57) ABSTRACT

The present disclosure relates to a composite film made of at least LCP and a fiber fabric, for example presenting a thickness of less than 0.10 mm, as well as articles comprising such composite films, exhibiting low dielectric constant and dissipation factors and being suitable for mobile electronic device components, for example flexible printed circuit board (FPC).

21 Claims, No Drawings

COMPOSITE FILMS FOR MOBILE ELECTRONIC DEVICE COMPONENTS

The present application is a national stage entry under 35 U.S.C. § 371 of International Application No. PCT/EP2022/072061 filed on Aug. 5, 2022, which claims the priority of provisional application U.S. 63/230,303 filed on Aug. 6, 2021. The entire contents of these applications are explicitly incorporated herein by this reference. In case of any incoherency between the present application and the PCT application that would affect the clarity of a term or expression, it should be made reference to the present application only.

TECHNICAL FIELD

The present disclosure relates to composite films comprising at least one Liquid Crystalline Polyester (LCP) and at least one fiber fabric (F) exhibiting low dielectric constant and dissipation factors, making them well-suited for mobile electronic device components, more particularly flexible printed circuit boards (FPC)

BACKGROUND

The invention relates to the field of copper foil laminate structures.

Due to their reduced weight and high mechanical performance, polymer compositions are widely used to manufacture mobile electronic device components. There is now a high demand from the market for polymer compositions to be used to manufacture mobile electronic device components having improved dielectric performances (i.e. low dielectric constants and dissipation factor).

In mobile electronic devices, the material forming the various components and housing can significantly degrade wireless radio signals (e.g. 1 MHZ, 2.4 GHz, 5.0 GHZ, 20.0 MHz and 30 MHz frequencies) transmitted and received by the mobile electronic device through one or more antennas. The dielectric performances of the material to be used in mobile electronic devices can be determined by measuring the dielectric constant and the dissipation factor as they represent the ability of the material to interact with the electromagnetic radiation and disrupt electromagnetic signals (e.g. radio signals) travelling through the material. Accordingly, the lower the dielectric constant and the dissipation factor of a material at a given frequency, the less the material disrupts the electromagnetic signal at that frequency.

Polymer films are employed in the domain of mobile electronic device. For example, aromatic polyimide films in the form of a continuous aromatic polyimide film/copper foil laminate structure have been described for manufacturing flexible printed circuit boards (FPC), carrier tapes for tape-automated-bonding (TAB), and tapes of lead-on-chip (LOC) structure. Such films are presented as showing good high temperature resistance, good chemical properties, high electrical insulating property, and high mechanical strength. However, polyimide films do not show the expected dielectric performance, especially the dissipation factor of polyimide films is too high to be used in applications at high frequency (≥20 GHZ). In addition, the dissipation factor at high frequency of polyimide films gets even worse under humid environment, due to the moisture absorption.

U.S. Pat. No. 8,741,790 relates to a PTFE/fiberglass composites useful as conveyor belts. Conveyor belts made from PTFE resins are used in many various applications. Because many of the applications rely on heat being transferred through the belts, belt thicknesses are preferably kept to a minimum. As described in the document, thicknesses typically range from as low as 5 mils (i.e. 0.127 mm) to possibly as high as 20 mils (i.e. 0.508 mm). The films described in this document are however not suited for flexible printed circuit boards (FPC).

US 2012/0135218 and JP 2006/278647 disclose a resin-impregnated sheet prepared with a liquid crystal polyester exhibiting a different composition from the composition of the LCP of the invention.

U.S. Pat. No. 7,063,892 B2 discloses LCP with a different composition.

Technical Problem

In copper foil laminate structures, there is need for a material exhibiting a combination of properties, even at low thicknesses. Indeed, the material needs to exhibit good dielectric properties, notably a low Df and a low Dk, even in the presence of moisture, and good mechanical properties.

Moreover, the material needs to exhibit improved thermal resistance, notably a high melting point (Tm), to avoid warping of the material during the preparation of the laminate.

The composite film of the invention aims at solving this technical problem.

SUMMARY

The invention is set out in the appended set of claims.

The invention relates to a composite film.

The invention also relates to methods for preparing such composite films and to an article comprising the composite films.

The invention also relates to the use of the articles comprising the composite films.

More details on these subject-matters are provided below.

DISCLOSURE OF THE INVENTION

In the Present Application:
  any description, even though described in relation to a specific embodiment, is applicable to and interchangeable with other embodiments of the present invention;
  where an element or component is said to be included in and/or selected from a list of recited elements or components, it should be understood that in related embodiments explicitly contemplated here, the element or component can also be any one of the individual recited elements or components, or can also be selected from a group consisting of any two or more of the explicitly listed elements or components; any element or component recited in a list of elements or components may be omitted from such list; and
  any recitation herein of numerical ranges by endpoints includes all numbers subsumed within the recited ranges as well as the endpoints of the range and equivalents.

Composite Film

According to an Embodiment, the Composite Film Comprises:
  at least one liquid crystalline polyester (LCP), and
  at least one fiber fabric (F), wherein the LCP is manufactured from the following monomers: terephthalic acid (PTA) (or derivative), a biphenol (BP) (or derivative), an aromatic hydroxycarboxylic acid, and an aromatic dicarboxylic acid distinct from terephthalic acid, wherein the aromatic dicarboxylic acid and the aromatic hydroxycarboxylic acid include a napthyl group.

In some embodiments, the LCP contains at least 50.0 mol %, at least 60.0 mol %, at least 70.0 mol %, at least 80.0 mol %, at least 90.0 mol %, at least 95.0 mol %, at least 99.0 mol %, or at least 99.9 mol % of repeat units formed from the aforementioned monomers. As used herein, mol % is relative to the total proportion of repeat units in the LCP.

Because of the chemical nature of the resin used to prepare the film, in combination with the fiber fabric, the films of the present invention not only present the appropriate flexibility for mobile electronic device components, but they do also present the right set of mechanical properties, including tensile strength and coefficient of thermal expansion.

The composite film of the invention presents a broad range of possible thicknesses. It may present a low thickness, for example comprised between 0.10 mm and 0.005 mm, preferably between 0.09 and 0.01 mm, for example between 0.08 and 0.02 or between 0.07 and 0.03 mm. It may present a higher thickness, for example comprised between 10.0 mm and 0.10 mm, preferably between 5.0 mm and 0.20 mm, for example between 3.0 mm and 0.40 or between 2.0 mm and 0.50 mm. The thickness of the composite film can be measured by any means; for example, it can be measured using a thickness gauge. The inventors have realized that such thicknesses is technically relevant in the sense that a film with a thickness in the claimed range keeps its needed bendability for the application, while at the same time maintain its shape, thanks to the fiber fabric, which make such films well-fitted for use as mobile electronic device component, such as copper clad laminate (CCL) and flexible printed circuit boards (FPC).

The biphenol (BP), aromatic hydroxycarboxylic acid and aromatic dicarboxylic acid distinct from terephthalic acid (TPA) are preferably represented by the following formulae (I), (II) and (III), respectively:

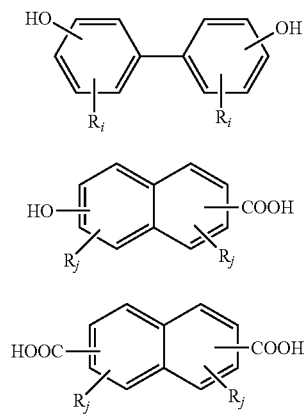

where:
R$_i$ and R$_j$, at each location, is independently selected from the group consisting of a halogen, an alkenyl, an alkynyl, an aryl, an ether, a thioether, a carboxylic acid, an ester, an amide, an imide, an alkali or alkaline earth metal sulfonate, an alkyl sulfonate, an alkali or alkaline earth metal phosphonate, an alkyl phosphonate, an amine, and a quaternary ammonium;
i, at each location, is an independently selected integer from 0 to 4; and
j, at each location, is an independently selected integer from 0 to 3.

For clarity, i and j are linked to the number of substituents present on the ring. For example, referring to left phenyl ring of Formula (I), if i=3, then the phenyl ring is substituted by 3 independently selected R groups and has 1 hydrogen on the ring. As another example, referring to the left phenyl ring of formula (I) again, if i=0, then the phenyl ring has 4 hydrogens on the ring. Similar notation is used throughout.

Preferably, the biphenol (BP), aromatic hydroxycarboxylic acid and aromatic dicarboxylic acid distinct from terephthalic acid (TPA) are represented by the following formulae respectively:

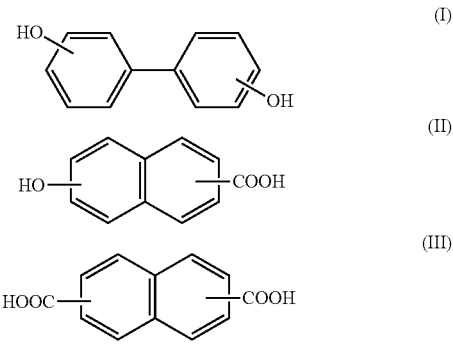

Various isomers of biphenol (BP) can be used to prepare the LCP of the present invention. Biphenol (BP) may be for example be in the form of 4,4'-biphenol (4,4'-BP), 3,4'-biphenol (3,4'-BP) or 3,3'-biphenol (3,3'-BP) or a derivative of the biphenol, for example a diacetoxybiphenyl. One or several of these isomers can be used. Preferably, at least 4,4'-biphenol is used to prepare the LCP of the present invention.

Most preferably, the biphenol (BP) is 4,4'-biphenol (4,4'-BP) or a derivative, for example 4,4'-diacetoxybiphenyl.

Preferably, the hydrocarboxylic acid is 6-hydroxy-2-naphthoic acid (HNA) or a derivative, for example 6-acetoxy-2-naphthoic acid (AcHNA).

Preferably, the aromatic dicarboxylic acid distinct from terephthalic acid is 2,6-naphthalene dicarboxylic acid (NDA) or a derivative.

Preferably, the liquid crystalline polyester (LCP) is manufactured from terephthalic acid (TPA) (or derivative), 4,4'-biphenol (4,4'-BP) (or derivative, for example diacetoxybiphenyl (AcBP)), 6-hydroxy-2-naphthoic acid (HNA) (or derivative, for example 6-acetoxy-2-naphthoic acid (AcHNA)), and 2,6-napthalene dicarboxylic acid (NDA) (or derivative).

More preferably, the liquid crystalline polyester (LCP) is manufactured from terephthalic acid (TPA), 4,4'-biphenol (4,4'-BP), 6-hydroxy-2-naphthoic acid (HNA) and 2,6-napthalene dicarboxylic acid (NDA).

These specific combinations of components disclosed above make it possible to obtain a composite film with a good combination of properties, notably dielectric performances.

According to an Embodiment, the Composite Film Comprises:
at least one Liquid Crystalline Polyester (LCP), and
at least one fiber fabric (F), wherein the LCP comprises:

a) repeat units of formula (IV):

b) repeat units of formula (V):

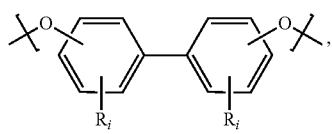

and c) repeat units of formula (VI):

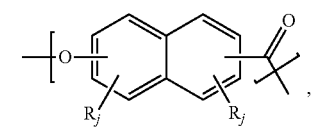

and d) repeat units of formula (VII):

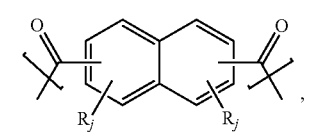

wherein $R_i$ and $R_j$, at each location, is independently selected from the group consisting of a halogen, an alkenyl, an alkynyl, an aryl, an ether, a thioether, a carboxylic acid, an ester, an amide, an imide, an alkali or alkaline earth metal sulfonate, an alkyl sulfonate, an alkali or alkaline earth metal phosphonate, an alkyl phosphonate, an amine, and a quaternary ammonium;

i, at least location, is an independently selected integer from 0 to 4; and j, at each locations, is an independently selected integer from 0 to 3.

Preferably, i, at each location, is 0 and j, at each location, is 0

Preferably, repeat units (V) to (VII) are respectively formed from the polycondensation of 4,4'-biphenol (4,4'-BP); 6-hydroxy-2-naphthoic acid (HNA); and 2,6-naphthalene dicarboxylic acid (NDA), or their derivatives. In this situation, the repeat units of the LCP are the following ones:

a) Repeat Units of Formula (IV):

b) Repeat Units of Formula (V):

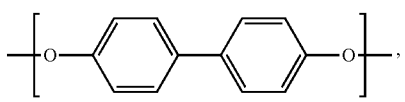

and c) Repeat Units of Formula (VI):

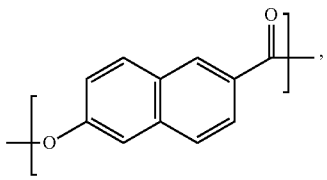

d) Repeat Units of Formula (VII); and

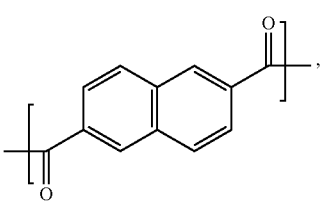

The person of ordinary skill in the art will recognize that repeat units (IV) to (VII) are formed from the polycondensation of terephthalic acid (or derivative) and the monomers according to formulae (I) to (III), respectively.

The total proportion of repeat units (IV) to (VII) is at least 50.0 mol %. This proportion may be at least 60.0 mol %, at least 70.0 mol %, at least 80.0 mol %, at least 90.0 mol %, at least 95.0 mol %, at least 99.0 mol %, or at least 99.9 mol %.

The LCP is preferably a LCP consisting essentially in the above-mentioned repeat units (IV)-(VII).

In some embodiments, the proportion of repeat units (IV) is from 10.0 mol % to 25.0 mol % or from 10.0 mol % to 20.0 mol %.

In some embodiments, the proportion of repeat units (V) is from 10.0 mol % to 30.0 mol % or from 15.0 mol % to 25.0 mol %.

In some embodiments, the proportion of repeat units (VI) is from 30.0 mol % to 80.0 mol %, from 40.0 mol % to 70.0 mol %, from 50.0 mol % to 70.0 mol % or from 55.0 mol % to 65.0 mol %.

In some embodiments, the proportion of repeat units (VII) is from 1.0 mol % to 15.0 mol % or from 1.0 mol % to 10.0 mol %. The proportion of repeat units (VII) is preferably from 1.0 to 10.0 mol %, even more preferably from 1.0 mol % to 10.0 mol % (this value being excluded). This proportion is preferably from 2.0 mol % to 7.0 mol %.

The Proportions of Repeat Units (IV)-(VII) May be the Following Ones:
repeat units (IV): from 10.0 mol % to 20.0 mol %;
repeat units (V): from 15.0 mol % to 25.0 mol %;
repeat units (VI): from 30.0 mol % to 80.0 mol %;
repeat units (VII): from 1.0 mol % to 10.0 mol %.

The proportion of repeat units (IV) may preferably be from 10.0 mol % (value excluded) to 20.0 mol %.

The Proportions Repeat Units (IV)-(VII) May Also be the Following Ones:
repeat units (IV): from 13.0 mol % to 17.0 mol %;
repeat units (V): from 18.0 mol % to 22.0 mol %;
repeat units (VI): from 58.0 mol % to 62.0 mol %;
repeat units (VII): from 2.0 mol % to 7.0 mol %.

Or the Following Ones:
repeat units (IV): from 14.0 mol % to 17.0 mol %;
repeat units (V): from 18.0 mol % to 22.0 mol %;
repeat units (VI): from 58.0 mol % to 62.0 mol %;
repeat units (VII): from 2.0 mol % to 6.0 mol %.

The molar ratio (VII)/[(VII)+(IV)] is preferably lower than 0.45.

The person of ordinary skill in the art will recognize that each combination of the individual ranges for each repeat unit (IV) to (VII) is specifically contemplated and within the scope of the present disclosure.

In some embodiments, the LCP has a Tg ("glass transition temperature") of at least 100° C., at least 110° C. or at least 115° C. In some embodiments, the LCP has a Tg of no more than 140° C., no more than 135° C. or no more than 130° C. In some embodiments, the LCP has a Tg of from 100° C. to 140° C., from 110° C. to 135° C., or from 115° C. to 130° C. Tg of the LCP can be measured by Dynamic Mechanical Analysis ("DMA") as the peak temperature on the tan delta curve according to ASTM D5279.

Melting Point (Tm)

The LCP has generally a Tm ("melting point") of at least 305° C. This ensures that the composite film of the invention exhibits thermal resistance.

Tm may be at least 310° C., at least 320° C., or at least 330° C. In some embodiments, the LCP has a Tm of no more than 390° C., no more than 380° C., or no more than 370° C.

The LCP may have a Tm between 310° C. and 390° C., between 320° C. and 380° C., or between 330° C. and 370° C.

The LCP preferably has a Tm between 305° C. and 370° C., more particularly between 305° C. and 340° C.

Tm can be measured by Differential Scanning calorimetry ("DSC") according to ASTM D3418, notably using a heating of 20° C./min and cooling rate of 10° C./min.

Tm can more particularly be measured by Differential Scanning calorimetry ("DSC") according to ASTM D3418 using a heating rate of 20° C./min and a cooling rate of 10° C./min. Following an initial equilibration at 200° C., three scans are used for each DSC test: a first heat up to 360° C., followed by a first cool down to 200° C., followed by a second heat up to 360° C. The Tm is then determined from the second heat up.

Glass Transition Temperature (Tg)

In some embodiments, the LCP exhibits a Tg of at least 40° C., at least 60° C. or at least 80° C. In some embodiments, the semi-aromatic, semi-crystalline polyester has a Tg of no more than 150° C. or no more than 130° C.

Number Average Molecular Weight ("Mn")

In some embodiments, the LCP has a number average molecular weight ("Min") of at least 5,000 g/mol. In some embodiments, the LCP has a Mn of no more than 20,000 g/mol. In some embodiments, the LCP has a Mn of from 5,000 g/mol to 20,000 g/mol. The number average molecular weight Mn can be determined by gel permeation chromatography (GPC) according to ASTM D5296 and using hexafluoroisopropanol solvent and poly(methyl methacrylate) standard.

Other Ingredients in the LCP

The LCP may include at least one additive blended with the LCP and selected in the group consisting of plasticizers, light and weathering stabilizers, antistatic agents, ultraviolet absorbing agents, dyes, pigments, viscosity agents and lubricants; and/or
at least one filler blended with the LCP and selected in the group consisting of glass fibers, silica, alumina, aluminium borate, silicon carbide, mica, talc, clay, titanium oxide, zirconia, kaolin, calcium carbonate, magnesium carbonate, calcium sulfate, barium sulfate, magnesium hydroxide, quartz, graphite, carbon fibers, bentonite, calcium phosphate.

The Invention Also Relates to a Composite Film Comprising or Consisting Essentially of or Consisting of:
at least one Liquid Crystalline Polyester (LCP) as disclosed herein;
at least one additive blended with the LCP and selected in the group consisting of plasticizers, light and weathering stabilizers, antistatic agents, ultraviolet absorbing agents, dyes, pigments, viscosity agents and lubricants; and/or
at least one filler blended with the LCP and selected in the group consisting of glass fibers, silica, alumina, aluminium borate, silicon carbide, mica, talc, clay, titanium oxide, zirconia, kaolin, calcium carbonate, magnesium carbonate, calcium sulfate, barium sulfate, magnesium hydroxide, quartz, graphite, carbon fibers, bentonite, calcium phosphate;
at least one fiber fabric (F) as disclosed herein.

Preparation of the LCP

The LCP described herein can be prepared by any conventional method adapted to the synthesis of LCPs by polycondensation. The LCP is generally prepared by polymerization of a reaction mixture including the monomers ad defined above. Of course, the proportions of the monomers are defined such as to target the composition of the LCP.

The Reaction Mixture May then Comprise:
(A) from 10 mol % to 25 mol % or from 10 mol % to 20 mol % of terephthalic acid (TPA) (or derivative);
(B) 10 mol % to 30 mol % or from 15 mol % to 25 mol % of a monomer according to formula (I) (or derivative);
(C) from 30 mol % to 80 mol %, from 40 mol % to 70 mol %, from 50 mol % to 70 mol % or from 55 mol % to 65 mol % of a monomer according to formula (II) (or derivative); and
(D) from 1 mol % to 15 mol % or from 1 mol % to 10 mol % of a monomer according to formula (III) (or derivative).

The reaction mixture usually includes an anhydride of a carboxylic acid, preferably acetic anhydride.

The reaction mixture preferably includes a catalyst, e.g. potassium acetate and magnesium acetate.

The person of ordinary skill in the art will recognize that each combination of the individual concentration ranges for each repeat units of forms (IV) to (VII) is specifically contemplated and within the scope of the present disclosure.

The proportion of monomers is such that the molar ratio (OH)/(COOH) is between 0.8 and 1.2, preferably between 0.9 and 1.1, even more preferably between 0.95 and 1.05.

The LCP is conveniently prepared by the following recipe: the reaction mixture is heated at a temperature sufficient to induce the polycondensation of the monomers. The temperature at which the reaction mixture is heated is generally at least 150° C. The mixture is further heated to remove the volatiles, notably the acetic acid formed. The solid material recovered from the reaction mixture is then further heated under a continuous nitrogen flow. The temperature at which the solid material is further heated is generally at least 250° C.

The conditions (cycle of temperature and durations) given in the experimental section may more particularly be followed to prepare the LCP used in the invention.

The LCP may include at least one additive and/or at least one filler as mentioned above. The additive(s) and/or filler(s) are blended with the LCP by conventional techniques known to the skilled person. A preferred technique consists in blending the additive(s) and/or filler(s) in the LCP in the molten state using e.g. an extruder, a kneader or a Banbury mixer.

As detailed below, the LCP or the LCP including the additive(s) and/or filler(s) is conveniently in the powder form. The grinding technique may be conveniently used to obtain the product in the powder form.

Fiber Fabric

According to the present invention, the fiber fabric (F) used in the composite film may be an aramid fabric, a glass fiber fabric or a quartz fabric. Preferably, the fiber fabric (F) comprises glass fibers or quartz.

The fiber fabric (F) may be a woven or non-woven fabric. The fiber fabric (F) is preferably woven.

The fiber fabric (F) may for example present an average thickness of about 200 μm or less, for example of 180 μm or less or of 160 μm or less. The fibers in the fiber fabric (F) may present an average diameter of about 25 μm or less, for example of about 23 μm or less or of 21 μm or less.

In some embodiments, the fiber fabric (F) is such that it has an average area weight (in grams per square meter or gsm) comprised between 10 gsm and 100 gsm, for example between 12 gsm and 90 gsm or between 15 gsm and 80 gsm.

In some embodiments, the fabric is such that it has a thickness between 0.01 mm/1.1 mils and 0.1 mm/1.1 mils (1 mil=0.0254 mm; 1.1 mil=0.0279 mm); or a thickness between 0.01 mm/2.4 mils and 0.1 mm/2.4 mils (2.4 mil=0.0609 mm).

The use of such fiber fabric in the film of the invention is advantageous, as it brings additional stiffness or dimensional stability if required. These features can be advantageously optimized based on the choice of certain fabrics, in order to fit certain end-use requirements.

Preferably, the fiber fabric (F) is a glass fiber fabric.

The glass fibers, and consequently the glass fiber fabric, are preferably characterised by low dielectric constant and low dissipation factor.

The glass fiber fabric may additionally or alternatively be characterized by a dielectric constant Dk at 1 GHz, measured using a transmission line method and a vector network analyzer, of less than 5.5 and a dissipation factor Df at 1 GHz, measured using a transmission line method and a vector network analyzer, of less than 0.0030.

The glass fiber fabric preferably has a dielectric constant Dk at 1 GHZ, measured using a transmission line method and a vector network analyzer, of less than 5.0. The dielectric constant Dx at 1 GHz, is generally not less than 3.0. The glass fiber fabric preferably has a dissipation factor Dr at 1 GHZ, measured using a transmission line method and a vector network analyzer, of less than 0.0025, even less than 0.0020. The dissipation factor Dr at 1 GHz is generally not less than 0.0001.

The glass fiber fabric may be made of glass fibers comprising at least 33.0 parts by mass to 48.0 parts by mass of silicon oxide; 1.0 parts by mass to 5.0 parts by mass of alumina; 5.0 parts by mass to 10.0 parts by mass of titanium oxide; 0.5 parts by mass to 4.0 parts by mass of zirconium oxide; and at least one of the following oxides holmium oxide, alkaline earth metal oxides, neodymium oxide, and iron oxide.

The glass fiber fabric may also be made of glass fibers having the following composition: silicon oxide, 35.0 parts by mass to 48.0 parts by mass; alumina, 1.0 parts by mass to 5.0 parts by mass; titanium oxide 5.5 parts by mass to 10.0 parts by mass; zirconium oxide, 0.5 parts by mass to 4.0 parts by mass; holmium oxide, less than or equal to 3.0 parts by mass; alkaline earth metal oxides, 32.0 parts by mass to 47.5 parts by mass, with respect to the total mass of the fiber. Alternatively, the glass fiber fabric may be made of fibers having the following composition: silicon oxide, 33.0 parts by mass to 46.0 parts by mass; alumina, 1.5 parts by mass to 5.0 parts by mass; titanium oxide, 5.0 parts by mass to 10.0 parts by mass; zirconium oxide, 0.5 parts by mass to 4.0 parts by mass; neodymium oxide, less than or equal to 2.5 parts by mass; iron oxide, less than or equal to 1.2 parts by mass; alkaline earth metal oxide, 31.0 parts by mass to 53.0 parts by mass, with respect to the total mass of the fiber.

The glass fiber fabric may preferably be made of NE-GLASS which is a low-dielectric-constant glass produced by Japanese company Nitto Boseki Co., Ltd.

The glass fiber fabric may preferably be made of a glass comprising between 45.0 and 65.0 wt % of $SiO_2$, between 13.0 and 30.0 wt % of $B_2O_3$, between 8.0 and 20.0 wt % of $Al_2O_3$ and less than 5.0 wt % of CaO and less than 5.0 wt % of MgO.

The glass fiber fabric may preferably be made of a glass covered by or disclosed in US 2003/0054936 or U.S. Pat. No. 7,678,721 B2, the content of which being incorporated herein.

The glass fiber fabric may preferably be made of a glass comprising between 50.0 and 60.0 wt % of $SiO_2$, between 10.0 and 18.0 wt % of $Al_2O_3$, between 14.0 and 20 wt % of $B2O_3$, between 1.0 and 6.0 wt % of MgO, between 2.0 and 5.0 wt % of CaO. The glass may also comprise between 0.5 and 5.0 wt % of $TiO_2$, between 0 and 0.3 wt % of $Li_2O$, between 0 and 0.3 wt % of $Na_2O$, between 0 and 0.5 wt % of $K_2O$ and between 0 and 2.0 of $F_2$. The content of MgO+CaO is preferably between 4.0 and 11.0 wt % and the content of $Li_2O+Na_2O+K_2O$ is preferably between 0 and 0.6 wt %.

The glass fiber fabric may preferably be made of a glass comprising between 52.0 and 60.0 wt % of $SiO_2$, between 11.0 and 16.0 wt % of $Al_2O_3$, between 20.0 and 30.0 wt % of $B2O_3$ and between 4.0 and 8.0 wt % of CaO. The glass may also comprise up to 2.0 wt % of $F_2$.

Composite Film

The composite film of the present invention may be a multi-layer composite film and may comprise several fiber fabrics (F), each being identical or distinct. The fiber fabrics may be of distinct thickness and/or of different composition. They may also be oriented in different direction. For example, the composite film may comprise a stack of 2, 3, 4, 5 and up to 10 fiber fabrics.

According to a preferred embodiment, the multi-layer composite film comprises several glass fiber fabrics (F).

In the multi-layered film of the present invention, the same LCP described herein may be present between each fiber fabric, or distinct LCP may be used between each fiber fabric. Alternatively, chemically distinct polymers may be used to bond the layers together. Examples of such chemically distinct polymers are polyimide and liquid-crystalline polymers.

According to the present invention, the composite film preferably comprises less than about 75.0 wt. % of fiber fabric, preferably between 5.0 and 70.0 wt. % or between 10.0 and 60.0 wt. % of fiber fabric per unit area of the composite film. At such weight percentages, the composite film readily accommodates contraction of the LCP as the composite film is cooled from elevated laminating temperatures.

According to the present invention, the composite film is preferably such that its volume fiber Vf is between 10.0 and 60.0 vol. %, for example between 10.0 and 50.0 vol. %, or from 10.0 and 40.0 vol. %, wherein Vf is calculated according to the following equation:

$$V_f = \frac{\text{Volume of fiber}}{\text{Volume of fiber} + \text{Volume of polymer}} \times 100$$

Vf may be between 10.0 and 30.0%.

The composite films of the present invention present some advantageous dielectric properties as defined in the claims. In Some Embodiments, the Films have the Following Dielectric Properties:
 a dielectric constant Dk at 5 GHz of less than 3.6, as measured by Split Post Dielectric Resonator (SPDR), IEC 61189-2-721:2015 after drying 1 h at 100° C., and/or
 a dissipation factor Df at 5 GHz of less than 0.002, as measured by Split Post Dielectric Resonator (SPDR), IEC 61189-2-721:2015 after drying 1 h at 100° C., and/or
 dielectric constant Dk at 20 GHz of less than 3.9, as measured by Split Cylinder Resonator, IPC TM-650 2.5.5.13 after drying 1 h at 100° C., and/or
 a dissipation factor Df at 20 GHz of less than 0.002, as measured by Split Cylinder Resonator, IPC TM-650 2.5.5.13 after drying 1 h at 100° C., and/or
 a dielectric constant Dk at 5 GHz of less than 3.6, as measured by Split Post Dielectric Resonator (SPDR), IEC 61189-2-721:2015 after immersion in water for 24 hours, and/or
 a dissipation factor Df at 5 GHz of less than 0.002, as measured by Split Post Dielectric Resonator (SPDR), IEC 61189-2-721:2015 after immersion in water for 24 hours, and/or
 dielectric constant Dk at 20 GHz of less than 3.7, as measured by Split Cylinder Resonator, IPC TM-650 2.5.5.13 after immersion in water for 24 hours, and/or
 a dissipation factor Df at 20 GHz of less than 0.002, as measured by Split Cylinder Resonator, IPC TM-650 2.5.5.13 after immersion in water for 24 hours.

The dissipation factor Df at 5 GHz may be less than 0.0020, preferably less than 0.0015, even more preferably less than 0.0010, as measured by Split Post Dielectric Resonator (SPDR), IEC 61189-2-721:2015 after drying 1 h at 100° C.

The dissipation factor Df at 20 GHz may less than 0.0020, preferably less than 0.0015, as measured by Split Cylinder Resonator, IPC TM-650 2.5.5.13 after drying 1 h at 100° C.

The dissipation factor Df at 5 GHz may be less than 0.0020, as measured by Split Post Dielectric Resonator (SPDR), IEC 61189-2-721:2015 after immersion in water for 24 hours.

The dissipation factor Df at 20 GHz may be less than 0.0020, preferably less than 0.0015, as measured by Split Cylinder Resonator, IPC TM-650 2.5.5.13 after immersion in water for 24 hours.

In some embodiments, the film is such that it has a coefficient of thermal expansion (CTE) over a temperature range of 0° C. to 300° C. of less than about $40 \times 10^{-6}/°$ C., for example less than $30 \times 10^{-6}/°$ C. or less than $20 \times 10^{-6}/°$ C. According to this embodiment, the film is such that it has a CTE of at least $1 \times 10^{-6}/°$ C. or at least $4 \times 10^{-6}/°$ C. CTE is measured with a thermo mechanical analyzer in tension mode according to ASTM D696.

Method for Preparing the Composite Film

The composite film of the present invention may be prepared by several methods.

Several of these methods start from a polymer powder comprising at least one LCP which is applied to at least one surface of the fiber fabric (F). According to these methods, the LCP powder applied to at least one surface of the fiber fabric is such that its $d_{50}$ is comprised between 0.1 and 100 µm, preferably between 1 and 90 µm or between 5 and 80 µm. The $d_{50}$ of the LCP powder can be measured by laser scattering in isopropanol. The polymer powder may include at least one additive selected in the group consisting of fillers, plasticizers, light and weathering stabilizers, antistatic agents, ultraviolet absorbing agents, dyes, pigments, viscosity agents and lubricants.

One of the Method of the Present Invention for Preparing a Composite Film of the Invention Comprises the Steps of:
 a) applying a polymer powder comprising at least one LCP to at least one surface of a fiber fabric, wherein the LCP powder is such that it presents a $d_{50}$ comprised between 0.1 and 100 µm,
 b) bonding the polymer powder to the fiber fabric at a pressure P of at least 0.3 MPa and/or a temperature T such that T≥Tm, wherein Tm is the melting temperature of the polymer powder (° C.).

At the temperature and pressure referenced above, the polymer powder undergoes a melt-phase enabling it to bond securely to the fiber fabric.

In some preferred embodiments, the LCP powder is applied to both surfaces of the fiber fabric. Protective films may be used to apply the LCP powder to both surfaces of the fiber fabric.

Preferably, step b) is performed at a pressure P of at least 0.4 MPa, at least 0.5 MPa or at least 0.6 MPa, and/or a temperature T such that T≥Tm, wherein Tm is the melting temperature of the polymer powder (° C.). In some embodiments, T is such that T≥Tm+5° C. In some embodiments, T is such that 280° C.≤T≤400° C., for example 290° C.≤T≤390° C. or 305° C.≤T≤380° C. or 330° C.≤T≤360° C.

Step b) may for example consist of subjecting the fiber fabric with the polymer powder applied thereto to compression molding using a hot press.

If a molding press is used in the method of the present invention, a release film between the film and the platten of the press may be used, so that no sticking of the film to the platten occurs. Any release film, which does not interfere with or alter the characteristics of the composite film, is suitable. The release film can be a polyimide, or a release coated metal foil such as aluminum, for example.

This process can be a batch process, meaning that individual films can be formed one at a time with a stack press, in an autoclave or in a vacuum/oven, for example, or a continuous process in which polymer powder is continuously laid over at least one fiber fabric, with or without one or more rolls of fiber fabric, and bonded thereto by means of high pressure and temperature with a double belt press, for example. The residence time in the press when the polymer powder is above its melting point is 0.5 to 1,000 sec. The typical double belt press may have a heating and cooling zone.

The amount of pressure and temperature applied to the film depends upon the type of polymer employed and upon the fiber fabric employed and the physical and dimensional properties of each, along with the operational, physical and dimensional properties of the press. The melt point of the polymer powder is an important feature along with the size of the polymer powder, the thickness of the fiber fabric as well as its ability to transfer heat, and of course how thick the composite film is (including multi-layered structures). Also, the heat transfer characteristics of the platten (of the press), its size and thickness, residence time of the film in the press, etc. are very important. For example, with a polymer powder comprising a LCP polymer as described above, the temperature should be above approximately 280° C. and a particularly preferred temperature range is approximately 330° C. to 380° C. While employing this particular polymer along with a fiber fabric having an average thickness of approximately 0.06 mm, the pressure to be applied to such a composite film should be in the range of from 0.3 MPa to 1.0 MPa.

The conditions provided in the experimental section can conveniently be used, notably to prepare a film with both surfaces of the fiber fabric impregnated with the LCP.

One of the Method of the Present Invention for Preparing a Composite Film Comprises the Steps of:
 a) applying a polymer powder comprising at least one LCP to at least one surface of a fiber fabric, wherein the LCP powder is such that it presents a $d_{50}$ comprised between 0.1 and 100 µm,
 b) sintering the polymer powder to the fiber fabric by means of an electromagnetic radiation, infrared or near-infrared radiation, of the powder.

The polymer powder may be applied via electrostatic coating.

According to this method the polymer powder is sintered at the surface of the fiber fabric, using an electromagnetic radiation, infrared or near-infrared radiation, for example a high power laser source such as an electromagnetic beam source.

Others methods for preparing the composite film start from a polymer material which is in the form of a slurry or a dispersion.

Others methods for preparing the composite film start from a polymer in the form of a thin film, which can be made exclusively of the LCP polymer described herein or may comprise additional components or additives.

One of these Methods for Preparing a Composite Film Comprises the Steps of:
 a) applying a polymer film comprising at least one LCP to at least one surface of a fiber fabric, wherein the polymer film is such that it preferably presents a thickness of less than 0.10 mm,
 b) bonding the polymer film to the fiber fabric at a pressure P of at least 0.3 MPa and/or a temperature T such that T≥Tm, wherein Tm is the melting temperature of the polymer powder (° C.).

Another method yet for preparing a composite film is also part of the present invention and comprises the steps of:
 a) applying a polymer film comprising at least one LCP to at least one surface of a fiber fabric, wherein the polymer film is such that it preferably presents a thickness of less than 0.10 mm,
 b) sintering the polymer film to the fiber fabric, for example by means of an electromagnetic radiation, infrared or near-infrared radiation, of the film.

Method for Preparing the Multi-Layer Composite Film

According to the present invention, several individual composite films may be stacked on each other to prepare a multilayer composite film. The composite films may for example be arranged in the same direction and/or they can be arranged in different directions. If necessary, the stacked multi-layer structure may be subjected to a new cycle (or several cycles) of compression molding using a hot press. Alternatively, the Multilayer Composite Film May be Prepared by:
 a) applying the polymer powder comprising at least one LCP to at least one surface of at least two fiber fabrics,
 b) stacking the at least two fiber fabrics on each other, and
 c) bonding the polymer powder to the fiber fabrics at a pressure P of at least 0.3 MPa and/or a temperature T such that T≥Tm, wherein Tm is the melting temperature of the polymer powder (° C.).

Alternatively step c) may consist of sintering the polymer powder, as described above.

In some embodiments, the polymer powder is in the shape of a slurry, for example a wet slurry.

In some other embodiments, the polymer may be in the shape of a thin film (preferably less than 0.09 mm) to be melted in order to bond with the fiber fabric.

Several of these options may be used to prepare one multi-layer composite film according to the invention.

End-Use Applications

While the composite film of the present invention may be characterized by a specific thickness, for example of less than 0.10 mm, the present invention also relates to assemblies of composite films according to the present invention, which can lead to a final assembly having a thickness above 0.10 mm.

The present invention also relates to an article or component article, comprising at least one composite film as described above, and optionally a metal layer, preferably a copper layer.

The present invention also relates to an article or component article, comprising at least one composite film as described above, and a metal layer, preferably a copper layer, wherein the composite film is in contact with the metal layer. Preferably, the composite film is bonded to the metal layer.

The present invention also relates to the use of at least one composite film to prepare a mobile electronic device article or component, for example a flexible printed circuit board (FPC) or a copper clad laminates (CCL).

The composite film of the present invention may notably be used to prepare flexible printed circuit boards (FPC), carrier tapes for tape-automated-bonding (TAB), and tapes of lead-on-chip (LOC) structure.

The present invention also relates to use of a LCP powder to prepare a composite film, for example having a thickness of less than 0.10 mm, said composite film further comprising at least one fiber fabric (F).

The present invention also relates to the use of a LCP powder as defined above to prepare a composite film, for example having a thickness of less than 0.10 mm.

EXPERIMENTAL SECTION

The disclosure will be now described in more detail with reference to the following examples, whose purpose is merely illustrative and not intended to limit the scope of the disclosure.

Tm of the LCP was measured by DSC according to the method indicated before.

Starting Materials

Fabric LD1035-127, commercially available from CTG. This woven glass fiber fabric exhibits the following properties: a dielectric constant Dk @ 1 GHz of 4.3-4.5 and a dissipation factor Df @ 1 GHz of 0.0016, both Dk and Df measured using a transmission line method and a vector network analyzer.

This glass fiber fabric exhibits the properties outlined in the table below:

| | |
|---|---|
| Thermal expansion coefficient (ASTM D696) | $3.28 \times 10^{-6}$/K |
| Refractive index (ASTM C1648) | 1.49% |
| Tensile strength (ASTM D2343) | 2000 MPa |
| Elastic modulus | 67 GPa |
| thickness | 0.035 mm or 35 µm |
| average area weight | 25.9 g/m² |

Fabric NTB 1017, commercially available from Nittobo. The glass fiber are made of a glass which has a lower contents of alkaline earth metals (such as CaO and MgO) than general-purpose E glass which is generally used for composite materials and a higher content of boric acid ($B_2O_3$). This specific composition ensures that the fibers exhibit a low dielectric constant and low dielectric dissipation factor.

This glass fiber fabric exhibits the properties outlined in the table below:

| | |
|---|---|
| density | 2.3 g/cm³ |
| Thermal expansion coefficient (ASTM D696) | $3.3 \times 10^{-6}$/K |
| Tensile strength (ASTM D2343) | 3100 MPa |
| Elastic modulus | 64 GPa |
| Dielectric constant at 1 GHz | 4.8 |
| Dielectric dissipation factor at 1 GHz | 0.0015 |

LCP #1: a liquid crystal polymer was prepared from the following monomers: terephthalic acid; 2,6-napthalene dicarboxylic acid; 6-hydroxy-2-naphthoic acid; 4,4'-biphenol.

The following monomers: terephthalic acid (139.4 g, Flint Hills Resources; 0.84 mol), naphthalenedicarboxylic (52.7 g, BASF; 0.243 mol), 2-hydroxy-6-naphthoic acid (611.1 g, from Ueno Fine Chemicals; 3.24 mol), 4,4'-biphenol (201.6 g, SI Group; 1.08 mol) and acetic anhydride (582.9 g, Aldrich) were charged into a 2-L glass reactor. Potassium acetate (0.06 g, Aldrich) and magnesium acetate (0.18 g, Aldrich) were used as catalysts. The mixture was heated to 165° C. and the acetylation reaction under reflux condition was allowed to proceed for 2 hrs. The heating then continued to 300° C. at the rate of 0.5° C. per minute while distilling off acetic acid from the reactor. The pre-polymer was discharged and allowed to cool down.

The material was then ground into powder for solid-state polymerization. The resin was advanced in a rotatory oven using the following profile: 1 hr at 270° C., 1 hr at 280° C., 1 hr at 290° C., 2 hrs at 300° C. and 3-6 hrs at 310° C. under continuous nitrogen purging. The resulting high molecular resin had melt viscosity between 300-600 Pa-s at 340° C. The LCP as obtained was then ground in a grinder and the powder used for the preparation of the composite films exhibited a $d_{50}$ of 56 µm (laser scattering, isopropanol).

Tm of LCP #1:325° C.

LCP #2: a liquid crystal polymer was formed from the following monomers: terephthalic acid; 2,6-napthalene dicarboxylic acid; 6-hydroxy-2-naphthoic acid; 4,4'-biphenol.

The following monomers: terephthalic acid (61.6 g, INEOS; 0.369 mol), 2,6-naphthalenedicarboxylic (148.3 g, BASF; 0.686 mol), 6-hydroxy-2-naphthoic acid (595.5 g, from Ueno Fine Chemicals; 3.167 mol), 4,4'-biphenol (201.5 g, SI Group; 1.082 mol) and acetic anhydride (574.1 g, Supelco) were charged into a 2-L glass reactor. Potassium acetate (0.062 g, Fisher) and magnesium acetate (0.186 g, Acros) were used as catalysts. The mixture was heated to 165° C. and the acetylation reaction under reflux condition was allowed to proceed for 2 hrs. The heating then continued to 300° C. at the rate of 0.5° C. per minute while distilling off acetic acid from the reactor. The pre-polymer was discharged and allowed to cool down. The material was then ground into powder for solid-state polymerization. The resin was advanced in a rotatory oven using the following profile: 1 hr at 200° C., 1 hr at 218° C., 1 hr at 240° C., 2 hr at 244° C., 2 hr at 266° C., 3 h at 270° C., 4 hr at 280° C. under continuous nitrogen purging.

Tm of LCP #2:275° C. This LCP #2 exhibits a lower Tm than LCP #1.

LCP #3: a liquid crystal polymer was formed from the following monomers: terephthalic acid; 2,6-napthalene dicarboxylic acid; 6-hydroxy-2-naphthoic acid; hydroquinone (instead of 4,4'-biphenol).

The following monomers: terephthalic acid (153.0 g, INEOS; 0.921 mol), 2,6-naphthalenedicarboxylic (57.6 g, BASF; 0.266 mol), 6-hydroxy-2-naphthoic acid (670.5 g, from Ueno Fine Chemicals; 3.563 mol), hydroquinone (134.3 g, Acros; 1.220 mol) and acetic anhydride (645.9 g, Supelco) were charged into a 2-L glass reactor. Potassium acetate (0.061 g, Fisher) and magnesium acetate (0.185 g, Acros) were used as catalysts. The mixture was heated to 165° C. and the acetylation reaction under reflux condition was allowed to proceed for 2 hrs. The heating then continued to 300° C. at the rate of 0.5° C. per minute while distilling off acetic acid from the reactor. The pre-polymer was discharged and allowed to cool down.

Tm of LCP #3: <275° C. This LCP #3 exhibits a lower Tm than LCP #2, so a Tm even lower than LCP #1.

Film Preparation Method

The LCP polymer (LCP #1) in the powder form was dispersed on the fabric in the following configuration: polymer/fabric/polymer. The resulting combination of components was then compression molded into a thin composite film using a hot press set up at a temperature of 330° C. and pressure of 1 MPa. The film was heated for approximately 10 minutes. The polymer powder melted and impregnated the fabric fibers. The film was immediately removed from the press and placed on a cool bench top and allowed to return to ambient temperature.

Test Methods

Dielectric Performances (Dk, Df)

The dielectric constant Dk and the dissipation factor Df were measured at 5 GHz by Split Post Dielectric Resonator (SPDR), IEC 61189-2-721:2015 after drying 1 h at 100° C. and after immersion in water for 24 hours.

The dielectric constant Dk and the dissipation factor Df were measured at 20 GHz by Split Cylinder Resonator, IPC TM-650 2.5.5.13 after drying 1 h at 100° C. and after immersion in water for 24 hours.

Coefficient of Thermal Expansion (CTE)

CTE was measured using a TMA equipment in tension mode pursuant to ASTM D696.

Tensile Strength

Tensile test was measured using an Instron mechanical test machine according to ASTM D882.

Volume of Fibers

Vf is Calculated According to the Following Equation:

$$V_f = \frac{\text{Volume of fiber}}{\text{Volume of fiber} + \text{Volume of polymer}} \times 100$$

Results

|  | Film #1 |
|---|---|
| Components | LD1035-127 LCP #1 |
| Vf | 15% |
| Thickness (mm) | 0.052 |
| Dk 5 GHz after drying 1 h at 100° C. | 3.3 |
| Df 5 GHz after drying 1 h at 100° C. | 0.0007 |
| Dk 20 GHz after drying 1 h at 100° C. | 3.6 |
| Df 20 GHz after drying 1 h at 100° C. | 0.0012 |
| Dk 20 GHz after immersion in water for 24 h | 3.6 |
| Df 20 GHz after immersion in water for 24 h | 0.0014 |

|  | Film #2 |
|---|---|
| Components | LD1035-127 LCP #1 |
| Vf | 26% |
| Thickness (mm) | 0.037 |
| Dk 5 GHz after drying 1 h at 100° C. | 3.5 |
| Df 5 GHz after drying 1 h at 100° C. | 0.0007 |
| Dk 20 GHz after drying 1 h at 100° C. | 3.8 |
| Df 20 GHz after drying 1 h at 100° C. | 0.0015 |

|  | Film #3 |
|---|---|
| Components | NTB 1017 LCP #1 |
| Vf | 10% |
| Thickness (mm) | 0.040 |
| Dk 20 GHz after drying 1 h at 100° C. | 3.5 |
| Df 20 GHz after drying 1 h at 100° C. | 0.0013 |
| Dk 20 GHz after immersion in water for 24 h | 3.4 |
| Df 20 GHz after immersion in water for 24 h | 0.0024 |

The invention claimed is:

1. A composite film comprising:
at least one Liquid Crystalline Polyester (LCP), and
at least one fiber fabric (F),
wherein the LCP comprises:
a) repeat units of formula (IV):

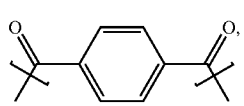

(IV)

b) repeat units of formula (V):

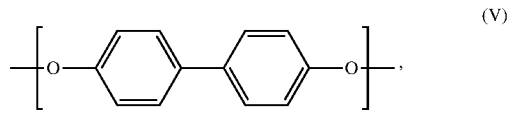

(V)

c) repeat units of formula (VI):

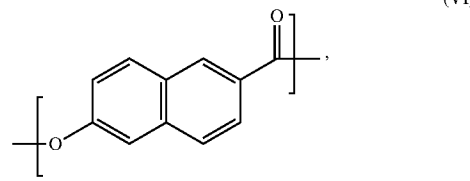

(VI)

and d) repeat units of formula (VII):

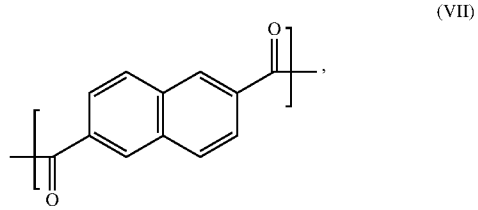

(VII)

wherein the proportions of these repeat units are the following:
repeat units (IV): from 10.0 mol % to 25.0 mol %;
repeat units (V): from 10.0 mol % to 30.0 mol %;
repeat units (VI): from 30.0 mol % to 80.0 mol %;
repeat units (VII): from 1.0 mol % to 10.0 mol %;
these proportions in mol % being based on the total number of moles in the LCP.

2. The composite film of claim 1, wherein the total proportion of repeat units (IV) to (VII) is at least 95.0 mol %.

3. The composite film of claim 1, wherein the repeat units of the LCP consist essentially of the repeat units (IV)-(VII).

4. The composite film of claim 1, wherein the proportions of repeat units (IV)-(VII) are the following:
repeat units (IV): from 10.0 mol % to 20.0 mol %;
repeat units (V): from 15.0 mol % to 25.0 mol %;
repeat units (VI): from 30.0 mol % to 80.0 mol %;
repeat units (VII): from 1.0 mol % to 10.0 mol %.

5. The composite film of claim 1, wherein the proportions of repeat units (IV)-(VII) are the following:
repeat units (IV): from 13.0 mol % to 17.0 mol %;
repeat units (V): from 18.0 mol % to 22.0 mol %;
repeat units (VI): from 58.0 mol % to 62.0 mol %;
repeat units (VII): from 2.0 mol % to 7.0 mol %.

6. The composite film according to claim 1 wherein the molar ratio (VII)/[(VII)+(IV)] is lower than 0.45.

7. The composite film according to claim 1, wherein the LCP includes at least one additive blended with the LCP and selected from the group consisting of plasticizers, light and weathering stabilizers, antistatic agents, ultraviolet absorbing agents, dyes, pigments, viscosity agents and lubricants.

8. The composite film according to claim 1, wherein the LCP includes at least one filler blended with the LCP and selected from the group consisting of glass fibers, silica, alumina, aluminium borate, silicon carbide, mica, talc, clay, titanium oxide, zirconia, kaolin, calcium carbonate, magnesium carbonate, calcium sulfate, barium sulfate, magnesium hydroxide, quartz, graphite, carbon fibers, bentonite, and calcium phosphate.

9. The composite film of claim 1, wherein the fiber fabric (F) is an aramid fabric, a glass fiber fabric or a quartz fabric.

10. The composite film of claim 1, wherein the fiber fabric (F) is a woven fabric.

11. The composite film of claim 1, wherein the fiber fabric (F) is such that it has an average area weight comprised between 10 gsm and 100 gsm.

12. The composite film of claim 1, presenting a thickness of less than 0.10 mm.

13. The composite film of claim 1, wherein the fiber fabric (F) is impregnated with the Liquid Crystalline Polyester (LCP) on both faces of the fiber fabric.

14. The composite film of claim 1, wherein the volume fiber Vf is between 10.0 and 60.0 vol. %, Vf being calculated according to the following equation:

$$V_f = \frac{\text{Volume of fiber}}{\text{Volume of fiber} + \text{Volume of polymer}} \times 100.$$

15. The composite film of claim 1, wherein the LCP exhibits a melting point Tm of:
at least 305° C.;
Tm being measured by Differential Scanning calorimetry ("DSC").

16. The composite film of claim 1, wherein the film has:
dielectric constant Dk at 20 GHz of less than 3.9, as measured by Split Cylinder Resonator, IPC TM-650 2.5.5.13 after drying 1 h at 100° C., and/or
a dissipation factor Df at 20 GHz of less than 0.002, as measured by Split Cylinder Resonator, IPC TM-650 2.5.5.13 after drying 1 h at 100° C.

17. The composite film of claim 1, wherein the film has:
dielectric constant Dk at 20 GHz of less than 3.7, as measured by Split Cylinder Resonator, IPC TM-650 2.5.5.13 after immersion in water for 24 hours, and/or
a dissipation factor Df at 20 GHz of less than 0.002, as measured by Split Cylinder Resonator, IPC TM-650 2.5.5.13 after immersion in water for 24 hours.

18. The composite film according to claim 1, exhibiting a dissipation factor Df at 20 GHz which is less than 0.0020, as measured by Split Cylinder Resonator, IPC TM-650 2.5.5.13 after drying 1 h at 100° C.

19. The composite film according to claim 1, exhibiting a dissipation factor Df at 20 GHz which is be less than 0.0020, as measured by Split Cylinder Resonator, IPC TM-650 2.5.5.13 after immersion in water for 24 hours.

20. An article or component article, comprising at least one composite film according to claim 1, and a metal layer, the composite film being in contact with the metal layer.

21. A method comprising preparing a mobile electronic device article or component with at least one composite film of claim 1.

* * * * *